United States Patent
Wong et al.

(10) Patent No.: US 7,023,945 B2
(45) Date of Patent: Apr. 4, 2006

(54) METHOD AND APPARATUS FOR JITTER REDUCTION IN PHASE LOCKED LOOPS

(75) Inventors: Keng L. Wong, Portland, OR (US); Chee How Lim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 632 days.

(21) Appl. No.: 10/171,597

(22) Filed: Jun. 17, 2002

(65) Prior Publication Data

US 2003/0231730 A1    Dec. 18, 2003

(51) Int. Cl.
*H03D 3/24* (2006.01)
*H03L 7/06* (2006.01)

(52) U.S. Cl. .................. 375/374; 375/375; 327/148
(58) Field of Classification Search ............... 375/375, 375/373, 371, 354, 374, 376; 327/156, 157, 327/141, 155, 144–148
See application file for complete search history.

(56) References Cited

U.S. PATENT DOCUMENTS

| | | | | |
|---|---|---|---|---|
| 5,783,956 A | * | 7/1998 | Ooishi ..................... | 327/157 |
| 5,818,288 A | * | 10/1998 | Le et al. ................. | 327/536 |
| 6,194,929 B1 | * | 2/2001 | Drost et al. ............. | 327/156 |
| 6,538,517 B1 | * | 3/2003 | Lu .......................... | 331/17 |
| 6,611,160 B1 | * | 8/2003 | Lee et al. ................ | 327/157 |
| 6,657,465 B1 | * | 12/2003 | Chu ........................ | 327/157 |
| 6,710,665 B1 | * | 3/2004 | Maneatis .................. | 331/17 |
| 6,765,428 B1 | * | 7/2004 | Kim et al. ................ | 327/534 |
| 6,784,752 B1 | * | 8/2004 | Gauthier et al. .......... | 331/16 |

OTHER PUBLICATIONS

John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.*

* cited by examiner

*Primary Examiner*—Tesfaldet Bocure
*Assistant Examiner*—Vineeta Panwalkar
(74) *Attorney, Agent, or Firm*—Blakely, Sokoloff, Taylor & Zafman LLP

(57) ABSTRACT

A method and apparatus for jitter reduction in a Phase Locked Loop (PLL) that includes determining a size of a original charge pump adequate to generate an appropriate control voltage to a Voltage Controlled Oscillator (VCO) of a PLL based on the charge pump receiving a single up signal or down signal within one cycle of a PLL input reference clock. N number of the up signal or down signal are generated to a second charge pump 1/N the size of the original charge pump. The N number of the up signal or the down signal occurs within one cycle of the PLL input reference clock. The second charge pump generates N second control voltage corrections each being 1/N the amplitude of the appropriate control voltage glitch, thus minimizing glitches on the second control voltages and reducing jitter to the VCO.

12 Claims, 5 Drawing Sheets

METHOD AND APPARATUS FOR JITTER REDUCTION IN PHASE LOCKED LOOPS

BACKGROUND

1. Field of the Invention

This invention relates to phase locked loops (PLLs), and more specifically to improving PLL jitter performance and stability.

2. Background

As product frequencies get higher every generation, a system becomes less tolerant to clock jitter. In systems using charge pump phase locked loops (PLLs) as clock generators, one of the main sources of clock jitter under normal phase-locked condition is the control voltage glitch. This glitch is the result of imperfections in the actual circuit behavior, particularly the combined response of the phase-frequency detector (PFD) output and charge pump (CP) mismatches. While the PFD outputs can usually be matched reasonably well, the mismatches in the CP are difficult to correct. This is especially true for PLLs using self-biasing techniques.

Currently, several ways are used in an attempt to resolve the problem. First, the loop filter capacitance is increased to lower the control voltage glitch magnitude. However, by doing this, the entire closed-loop response of the PLL is changed. For example, if the loop filter capacitance is increased relative to the charge pump current, the damping factor is also reduced which means degradation of the loop stability.

Secondly, a sample-and-reset approach has been proposed to spread the control voltage glitch over the entire reference period. The circuit implementation using this approach is non-trivial. This approach requires voltage switches within the analog section of the PLL, making the sensitive control voltage vulnerable to feed-through, charge injection and/or substrate coupling noises. In addition, the design complexity is significantly increased, hence, increasing risk.

Thirdly, a charge pump spreading approach is recently being introduced. This approach uses two copies of the charge pump, and they both are connected to the loop filter. One charge pump works in the conventional manner while the second charge pump receives a time-delayed version of the PFD outputs. However, using this approach requires twice as many charge pumps (i.e., twice the area). Further, with two copies of the charge pump the increased leakage current at the last stage of the charge pumps as well as its finite AC response may increase the static phase error.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
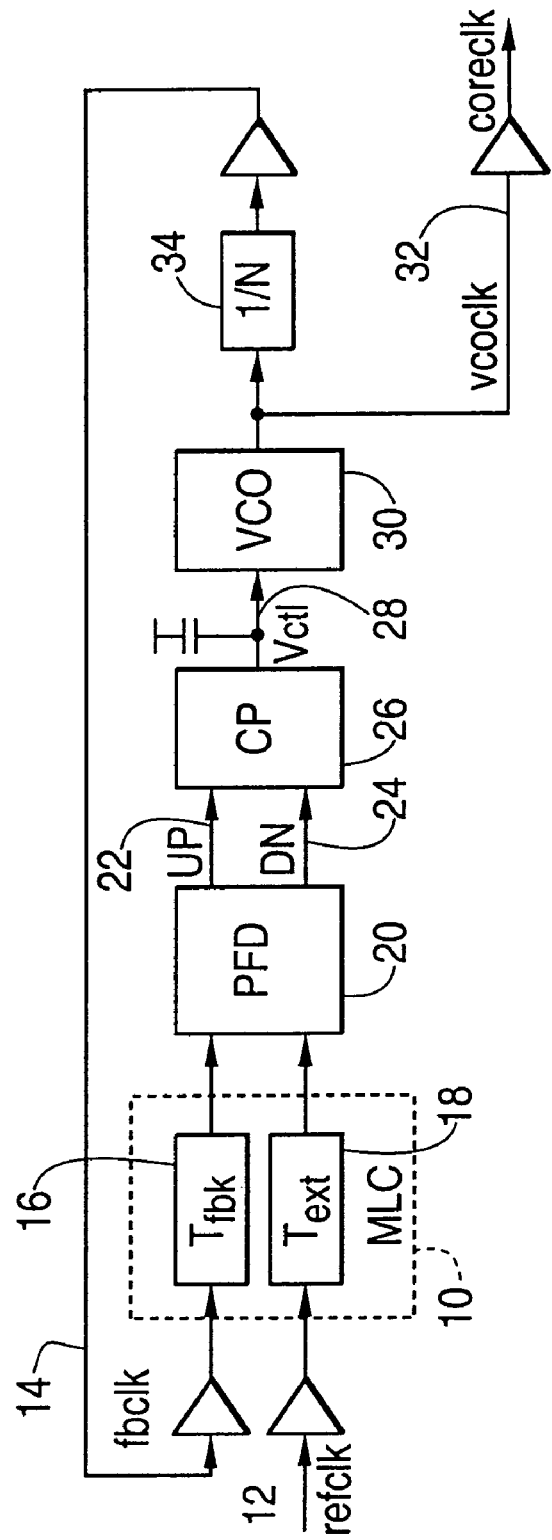
FIG. 1 shows a diagram of a system for jitter reduction according to an example embodiment of the present invention.

FIG. 1 shows a diagram of a system for jitter reduction according to an example embodiment of the present invention. Multi-loop circuit 10 may receive a reference clock 12 and a feedback clock 14. The reference clock 12 and feedback clock 14 may pass through delay circuits 18 and 16 respectively inside multi-loop circuit 10. Preferably, delay circuits 16 and 18 provide the same amount of delay. The reference clock 12 and feedback clock 14 may be recycled multiple times through the delay circuits 18 and 16 inside multi-loop circuit 10. A phase-frequency detector (PFD) 20 may receive the delayed feedback clock and delayed reference clock from multi-loop circuit 10 and use these clocks to generate either an up pulse 22 or a down pulse 24 to a charge pump (CP) 26. The phase-frequency detector 20 may compare the edges of the delayed reference clock and the delayed feedback clock, and translate the difference between the edges into either the up pulse 22 or the down pulse 24. Charge pump 26 generates a control voltage (Vctl) 28 based on the up pulse 22 or the down pulse 24. Control voltage 28 may be used to control a voltage controlled oscillator (VCO) 30. The output of voltage control oscillator 30 is a VCO clock 32 which may be sent to other devices or systems. The VCO clock 32 may also be divided down by divider 34 (also known as a multiplier) producing feedback clock 14 that may be then fed back into multi-loop circuit 10.

According to the present invention, the size and current from an original design for charge pump is decreased. In the example embodiment used to illustrate the present invention, the size and current from an original design for charge pump is cut in half. Specifically, a charge pump 26 one half the size of an original charge pump design and that produces one half the current of the original charge pump design is used. Moreover, according to the present invention, whereas in using an original design, only one up pulse or down pulse may be generated during a single reference clock cycle, a phase-frequency detector 20 according to the present invention generates more than one up pulses 22 or down pulses 24 (e.g., two in the example embodiment) within a single reference clock cycle. Therefore, instead of triggering (i.e., sending the up/down pulse) a large charge pump once with a single up/down pulse (e.g., as in an original design) to cause a large current source/sink (Vctl) on each cycle, a multi-loop circuit 10 according to the present invention, essentially breaks the phase error correction into two triggers, each resulting in a smaller amount of current source/sink (Vctl'). Consequentially, the average current being sourced/sunk remains the same as in a conventional (original design) approach, but the disturbance on the control voltage node (Vctl) is cut substantially (e.g., by approximately 50% for the two trigger example embodiment). Therefore, in methods and systems according to the present invention, control voltage glitches are reduced, therefore, resulting in lower jitter.

Although the present invention has been illustrated using a charge pump one half the size of an original charge pump design and a phase-frequency detector generating two up/down pulses within a reference clock cycle, the present invention is not limited to this embodiment. A charge pump may be used that is 1/N the size of an original charge pump design and consequently, N number of up/down signals may be generated to this charge pump to implement the present invention. Moreover, the elements shown in the system in FIG. 1 may be implemented in any way and still be within the present invention, e.g., in an electronic circuit design, in a microcircuit chip, etc.

Figure 2:
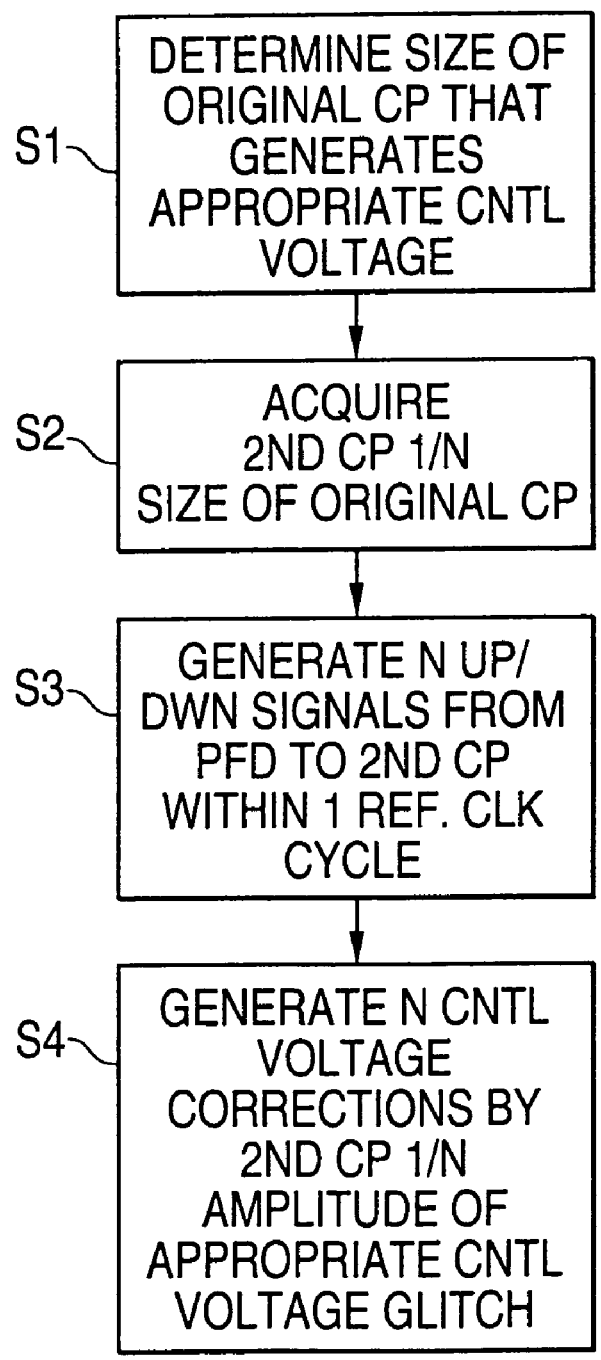
FIG. 2 shows a flowchart of a process for jitter reduction in a phase locked loop according to an example embodiment of the present invention.

FIG. 2 shows a flowchart of a process for jitter reduction in a phase locked loop according to an example embodiment of the present invention. The size of an original charge pump (CP) that generates an appropriate control voltage is determined S1. A second charge pump 1/N the size of the original charge pump is acquired or designed S2. N number of up/down signals may be generated from a phase-frequency detector (PFD) to the second charge pump within one reference clock cycle S3. N control voltage glitches (ΔVctl) may be generated by the second charge pump where the amplitude of each N control voltage glitch is 1/N of the amplitude of the appropriate control voltage glitch for an original charge pump design S4. Therefore, the average current sent to a voltage control oscillator (VCO) may remain the same, however, the control voltage perturbations are smaller, thus reducing control voltage glitches resulting in lower jitter to the VCO and consequently lower jitter on the VCO output clock.

Figure 3:
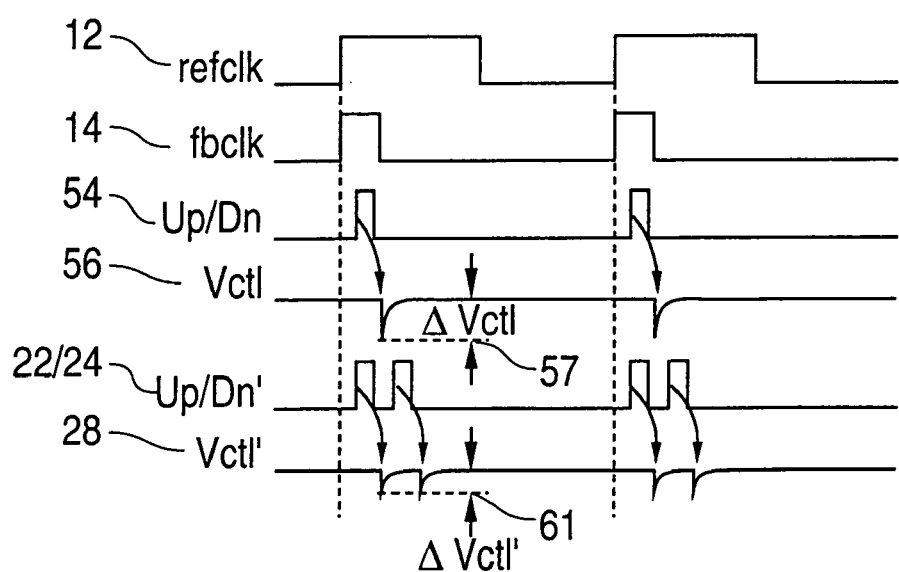
FIG. 3 shows a timing diagram for method and apparatus for jitter reduction in phase locked loops according to an example embodiment of the present invention.

FIG. 3 shows a timing diagram for method and apparatus for jitter reduction in phase locked loops according to an example embodiment of the present invention. The diagram shows timing according to current designs using an original charge pump design and a single up/down pulse during a single reference clock cycle, and timing according the present invention using the two trigger example embodiment. Reference clock signal 12 is shown and a feedback clock 14 underneath it. In current designs, a single up/down pulse 54 occurs during one reference clock 12 cycle. The single up/down pulse 54 in turn generates a control voltage 56 with an amplitude (ΔVctl) 57. In methods and apparatus according to the present invention, a charge pump that is smaller than an original charge pump size (e.g., one half the size) may be used. Further, if the charge pump size is one half, two up/down pulses 22/24 may be generated within a single reference clock 12 cycle to the one half the size charge pump.

The up/down pulses 22/24 may cause the charge pump to produce two associated control voltages (ΔVctl') 61. However, the amplitudes of the control voltages 61 may be approximately one half that of the amplitude 57 of control voltage 56. As noted previously, smaller control voltage amplitudes 61 reduce control voltage glitches, therefore, lowering the jitter seen at the voltage control oscillator output clock. Although the timing in FIG. 3 represents an embodiment of a charge pump one half the size of an original charge pump design, the present invention is not limited by this embodiment and a charge pump 1/N the size of an original charge pump may be used and therefore, N number of up/down pulses producing N number of control voltages to reduce jitter.

Figure 4:
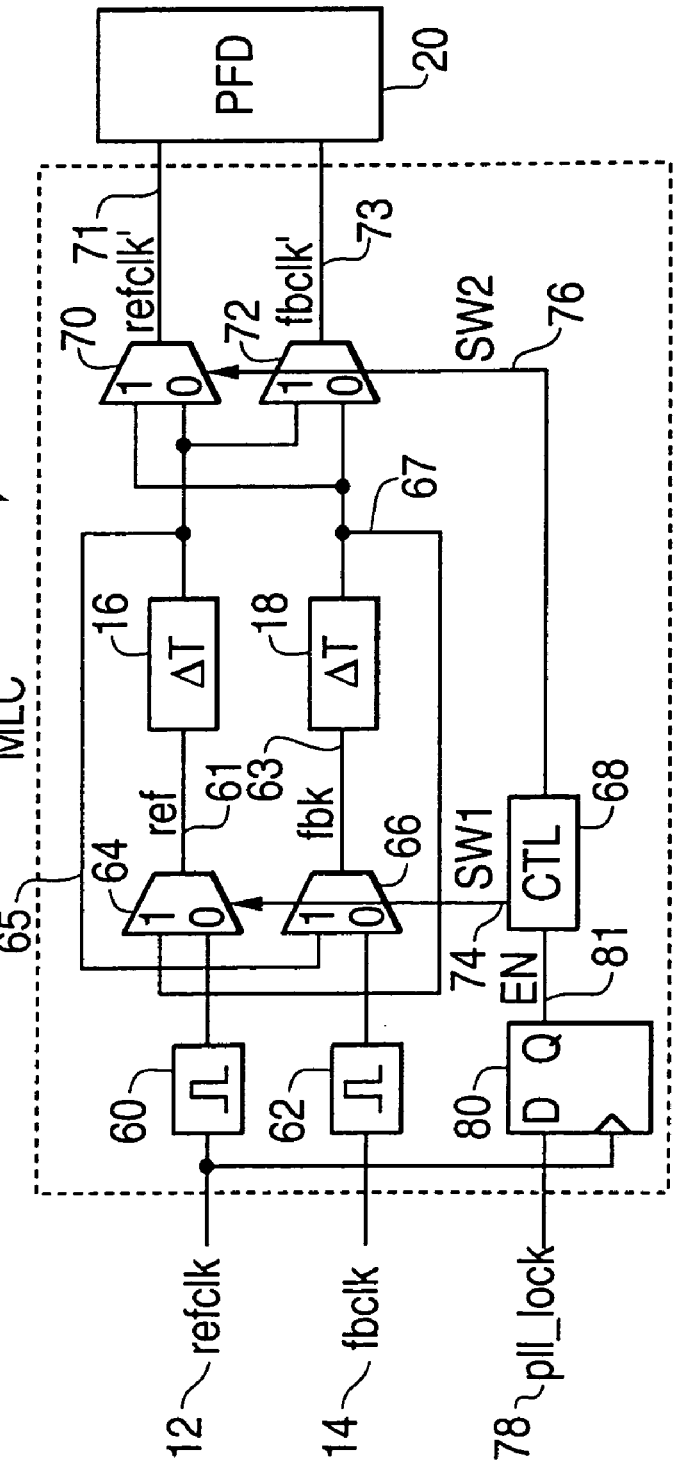
FIG. 4 shows a block diagram of an example multi-loop circuit according to an example embodiment of the present invention.

FIG. 4 shows a block diagram of an example multi-loop circuit according to an example embodiment of the present invention. Multi-loop circuit 10 may receive a reference clock 12 and a feedback clock 14. The reference clock 12 and feedback clock 14 signals may be converted into pulses using pulse generators 60 and 62 respectively, and pass through a set of switching devices (e.g., multiplexers) 64, 66 respectively. The switching devices 64 and 66 produce a ref output signal 61 and a fbk output signal 63 respectively. The ref output signal 61 and the fbk output signal 63 may be sent to delay devices 16 and 18, respectively, that delay these signals for a set amount of time. The delayed ref signal 65 and the delayed fbk signal 67 may be then sent to a second set of switching devices 70, 72 which produce a delayed reference clock pulse (refclk') 71 and a delayed feedback clock pulse (fbclk') 73. These pulses 71, 73 may be then sent to a phase frequency detector 20.

The delayed ref signal 65 and delayed fbk signal 67 from the output of delay devices 16 and 18, respectively, may be fed back to an input of switching devices 64 and 66 respectively. A controller 68 may control a SW1 signal 74 to control switching devices 64 and 66 to pass either reference clock 12 and feedback clock 14 to delay devices 16 and 18, or to pass the delayed feedback pulse 67 and the delayed reference pulse 65 to delay devices 16 and 18, respectively. Similarly, controller 68 may control a SW2 signal 76 to control switching devices 70 and 72 to pass either delayed ref signal 65 and delayed fbk signal 67 to the outputs of switching devices 70 and 72, (i.e., becoming the delayed reference clock pulse (refclk') 71 and delayed feedback clock pulse (fbclk') 73), respectively, or switch these around and pass the delayed feedback pulse 67 to become the delayed reference clock pulse 71 and delayed reference pulse 65 to become the delayed feedback clock pulse 73.

Multi-loop circuit 10 may also include a latch or storage device 80 that receives a pll lock signal 78 disabling multi-loop circuit 10 to prevent the circuit from interfering with PLL lock acquisition measures. The device 80 (e.g., D flip flop) may be used to ensure that the controller 68 wakes up in a predictable and desired state. To achieve larger than two triggers, a counter-based circuit may also be used in controller 68 to toggle signals SW1 74 and SW2 76 multiple times within the reference clock cycle.

The ΔT inside delay devices 16 and 18 represents a time spacing between the two triggers. After the delay devices 16, 18, the delayed signals 65 and 67 may be passed through the second set of switching devices 70, 72 to serve as the first trigger for a phase frequency detector 20, while a copy of these delayed signals 65, 67, may be recycled back to the first set of switching devices 64 and 66. The controller 68 may then control the SW1 signal 74 to change thus causing the switching by devices 64, 66 of the feedback clock 14 to the output of switching device 64 and the reference clock 12 to the output of switching device 66. These crossings may be reversed in the second set of switching devices 70, 72 through the SW2 control signal, 76 to regain correct output assignments for the second trigger. The method of crossing and reversing signals may be needed to eliminate the accumulation of delay mismatches that may occur as a result of circuit imperfections in delay devices 16 and 18.

The number of triggers and charge pump strength may be re-programmed to effect the damping factor and natural frequency if desired, since the combination changes the average charge pump current per cycle. For example, both the damping factor and natural frequency are proportional to the square root of average charge pump current and, therefore, if the system suffers from low damping factor and/or natural frequency, the number of triggers per cycle may be increased to increase the average charge pump current, thus improving the damping factor/natural frequency. The maximum number of triggers per cycle times the amount of spacing between triggers (ΔT) preferably should be less than one reference period. The spacing ΔT may be limited by the amount of time the control voltage takes to settle after each perturbation. The charge pump strength may be increased or decreased, but preferably not below a lower bound dictated by a power supply rejection performance requirement. Nevertheless, this tuning capability according to the present invention may be useful to reduce damping factor/natural frequency variations in frequency synthesizers where the divider N varies significantly.

Figure 5:
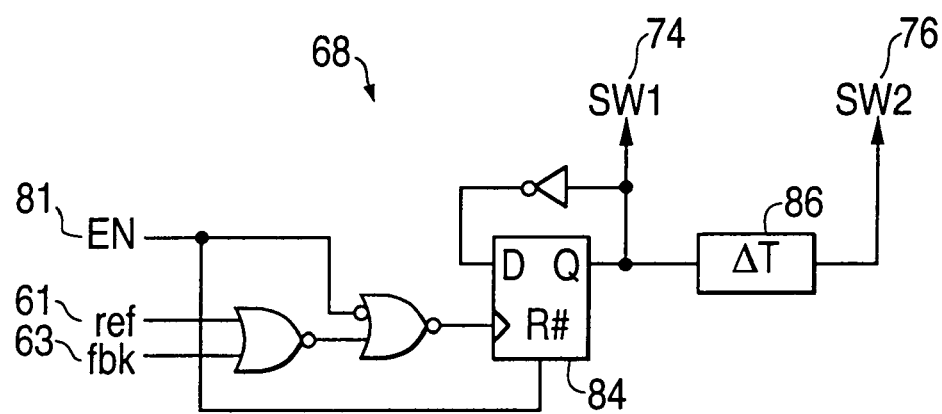
FIG. 5 shows a diagram of a controller circuit according to an example embodiment of the present invention.

FIG. 5 shows a diagram of a controller circuit according to an example embodiment of the present invention. In the controller 68 shown in FIG. 5, the enable signal 81, in this example embodiment, may be an active low signal that may be used to disable the controller 68. The controller 68 may receive the reference pulse 61 and feedback pulse 63 to determine when to clock flip flop 84. This results in toggling the SW1 signal 74 switching the switching devices 64 and 66. The SW1 signal 74 may be sent to a delay device 86 which has the same delay (ΔT) as delay devices 16 and 18, producing the SW2 signal 76 which controls switching devices 70 and 72. Although in this example embodiment, specific gates and configurations of gates and circuits have been used, the present invention is not limited by this specific example design of a controller.

Figure 6:
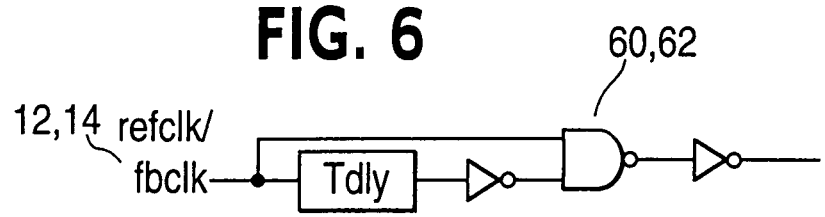
FIG. 6 shows a diagram of a pulse generator according to an example embodiment of the present invention.

FIG. 6 shows a diagram of a pulse generator according to an example embodiment of the present invention. This circuit may be used in pulse generators 60 and 62 to receive reference clock 12 or feedback clock 14 and generate a pulse. Other circuits or implementations may also be used to generate a pulse and still be within the spirit and scope of the present invention.

The present invention is advantageous in that control voltage glitches are reduced, therefore, resulting in lower jitter at the output of a phase locked loop. According to the present invention, by the use of a weaker charge pump (weaker than conventional techniques) in conjunction with a multi-loop circuit that re-triggers the charge pump multiple times within a reference period, the average charge pump current being sourced or sunk from a loop filter within a cycle is unchanged thus, the closed-loop response of the PLL is unchanged. However, according to the present invention, the peak control voltage glitch (also the peak amount of jitter) is significantly reduced since each correction involves a smaller amount of current steering.

Moreover, by using a weaker charge pump, static phase offset is reduced due to finite alternating current (AC) response of the charge pump's output structure. In self-biased PLLs with dual charge pumps, this may also mean lower third order loop filter capacitance can be used to achieve the same jitter performance, thus reducing area and making the loop response closer to second order for ease of design. In addition, the present invention allows the ability to use the combination of number of sub-cycle corrections and charge pump strengths to tune closed loop characteristics such as damping factor (DF) and natural frequency (NF). The damping factor and natural frequency described the relative stability characteristics of a second-order closed loop system. This tuning may be achieved with minimal impact to the sensitive analog section of a PLL, thus reducing design risk. Further, the present invention may also be extended to allow phase corrections beyond a reference clock. For a phase locked loop that has loop bandwidths significantly smaller than the reference frequency. This usually occurs in frequency synthesizers that utilize high fraction values.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A method for jitter reduction in a Phase Locked Loop (PLL) comprising:
   determining a strength of a first charge pump adequate to generate an appropriate first control voltage correction to a Voltage Controlled Oscillator (VCO) of a PLL based on receiving a single up signal or a down signal within one cycle of a PLL input reference clock; and
   generating N number of the up signal or the down signal to a second charge pump 1/N the strength of the first charge pump, the N number of the up signal or the down signal occurring within one cycle of the PLL input reference clock,
   wherein N is greater than one,
   wherein the second charge pump generates N second control voltage corrections each being 1/N the amplitude of the first control voltage correction generated by the first charge pump thus reducing glitches on the second control voltage corrections and reducing jitter to the VCO.

2. The method according to claim 1, wherein the second charge pump is ½ the strength of the first charge pump, and wherein generating N number of the up signal or the down signal comprises generating two of the up signal or the down signal to the second charge pump, the two of the up signal or the down signal occurring within one cycle of the PLL input reference clock, the second charge pump generating two of the second control voltage corrections each being ½ the amplitude of the first control voltage corrections thus reducing glitches on the second control voltage corrections and reducing jitter to the VCO.

3. The method according to claim 1, wherein the second charge pump is ⅓ the strength of the first charge pump, and wherein generating N number of the up signal or the down signal comprises generating three of the up signal or the down signal to the second charge pump, the three of the up signal or the down signal occurring within one cycle of the PLL input reference clock, the second charge pump generating three of the second control voltage corrections each being ⅓ the amplitude of the first control voltage corrections thus reducing glitches on the second control voltages and reducing jitter to the VCO.

4. The method according to claim 1, further comprising generating the N number of the up signal or the down signal to the second charge pump by a phase-frequency detector (PFD).

5. The method according to claim 4, further comprising:
converting the PLL input reference clock to a first pulse;
converting a feedback clock from the VCO to a second pulse; and
sending the first pulse and the second pulse to the PFD, the PFD generating the up signal or the down signal to the second charge pump based on a phase difference between the first pulse and the second pulse.

6. The method according to claim 5, further comprising:
delaying the first pulse and the second pulse by a same delay;
sending the delayed first pulse and the delayed second pulse to the PFD causing another up signal or down signal to be sent to the second charge pump; and
repeating the delaying and the sending until the N number of the up signal or the down signal have been sent to the second charge pump.

7. A system comprising:
a phase-frequency detector (PFD), the PFD coupled to receive a buffered feedback clock and a buffered reference clock and at least one delayed feedback clock and at least one delayed reference clock;
a charge pump, the charge pump coupled to receive an up signal and a down signal from the PFD and to generate a control voltage correction in response; and
a voltage controlled oscillator (VCO), the VCO coupled to the charge pump to receive the control voltage correction,
wherein the charge pump is 1/N the strength of a conventional charge pump adequate to generate an appropriate control voltage to the VCO based on receiving a single up signal or down signal within one cycle of the reference clock, the charge pump generating N control voltage corrections each being 1/N the amplitude of the appropriate control voltage of the conventional charge pump, thus reducing glitches on the N control voltage corrections and reducing jitter to the VCO, wherein N is greater than one.

8. The system according to claim 7, further comprising a multi-loop circuit (MLC), the MLC receiving a feedback clock and a reference clock and sending the buffered feedback clock and the buffered reference clock and the at least one delayed feedback clock and the at least one delayed reference clock to the PFD.

9. The system according to claim 7, further comprising a divider, the divider coupled to receive an output clock from the VCO and to divide a frequency of the output clock from the VCO to generate the feedback clock received by the MLC.

10. A microcircuit comprising:
a phase-frequency detector (PFD), the PFD coupled to receive a buffered feedback clock and a buffered reference clock and at least one delayed feedback clock and at least one delayed reference clock;
a charge pump, the charge pump coupled to receive an up signal and a down signal from the PFD and to generate a control voltage correction in response; and
a voltage controlled oscillator (VCO), the VCO coupled to the charge pump to receive the control voltage correction,
wherein the charge pump is 1/N the strength of a conventional charge pump adequate to generate an appropriate control voltage to the VCO based on receiving a single up signal or down signal within one cycle of the reference clock, the charge pump generating N control voltage corrections each being 1/N the amplitude of the appropriate control voltage of the conventional charge pump, thus reducing glitches on the N control voltage corrections and reducing jitter to the VCO, wherein N is greater than one.

11. The microcircuit according to claim 10, further comprising a multi-loop circuit (MLC), the MLC receiving a feedback clock and a reference clock and sending the buffered feedback clock and the buffered reference clock and the at least one delayed feedback clock and the at least one delayed reference clock to the PFD.

12. The microcircuit according to claim 10, further comprising a divider, the divider coupled to receive an output clock from the VCO and to divide a frequency of the output clock from the VCO to generate the feedback clock received by the MLC.

* * * * *